US008785910B2

(12) United States Patent  
Park et al.

(10) Patent No.: US 8,785,910 B2
(45) Date of Patent: Jul. 22, 2014

(54) THIN FILM TRANSISTOR, DISPLAY DEVICE INCLUDING THE SAME, AND METHOD OF MANUFACTURING THE DISPLAY DEVICE

(75) Inventors: Jong-Hyun Park, Yongin (KR); Chun-Gi You, Yongin (KR); Sun Park, Yongin (KR); Jin-Hee Kang, Yongin (KR); Yul-Kyu Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 472 days.

(21) Appl. No.: 12/926,665

(22) Filed: Dec. 2, 2010

(65) Prior Publication Data

US 2011/0133195 A1  Jun. 9, 2011

(30) Foreign Application Priority Data

Dec. 4, 2009  (KR) .................. 10-2009-0119984

(51) Int. Cl.
    H01L 29/04 (2006.01)
    H01L 29/10 (2006.01)
    H01L 21/84 (2006.01)
    H01L 21/00 (2006.01)
    H01L 31/00 (2006.01)

(52) U.S. Cl.
    USPC ............................................. 257/25; 438/158

(58) Field of Classification Search
    USPC .............................................. 257/59
    See application file for complete search history.

(56) References Cited

U.S. PATENT DOCUMENTS

| | | | |
|---|---|---|---|
| 2004/0004219 A1 | 1/2004 | Lee et al. | |
| 2004/0163585 A1* | 8/2004 | Park et al. | 117/84 |
| 2004/0266080 A1* | 12/2004 | Jyumonji et al. | 438/166 |
| 2006/0081844 A1* | 4/2006 | Hirosue et al. | 257/59 |
| 2006/0131585 A1 | 6/2006 | Kim et al. | |
| 2006/0186415 A1* | 8/2006 | Asano | 257/72 |
| 2006/0255719 A1* | 11/2006 | Oikawa et al. | 313/503 |
| 2007/0008445 A1* | 1/2007 | Hur | 349/43 |
| 2007/0058108 A1* | 3/2007 | Uehara et al. | 349/86 |
| 2007/0063228 A1* | 3/2007 | Kato et al. | 257/223 |
| 2008/0001156 A1* | 1/2008 | Sakakura et al. | 257/72 |
| 2008/0044982 A1 | 2/2008 | You | |
| 2008/0318398 A1* | 12/2008 | Moriwaka et al. | 438/487 |
| 2009/0224253 A1* | 9/2009 | Kato et al. | 257/66 |
| 2010/0127249 A1* | 5/2010 | Kim et al. | 257/40 |
| 2011/0017999 A1* | 1/2011 | Choi | 257/72 |
| 2011/0033991 A1* | 2/2011 | Hur | 438/158 |

FOREIGN PATENT DOCUMENTS

| | | |
|---|---|---|
| CN | 101034669 A | 9/2007 |
| KR | 10 2001-0078219 A | 8/2001 |
| KR | 10 2004-0087418 A | 10/2004 |
| KR | 10 2006-0032536 A | 4/2006 |
| KR | 10 2006-0084490 A | 7/2006 |
| KR | 10 2007-0095043 A | 9/2007 |
| KR | 10 2008-0002414 A | 1/2008 |
| KR | 10 2009-0047994 A | 5/2009 |

* cited by examiner

Primary Examiner — Matthew Landau
Assistant Examiner — Igwe U Anya
(74) Attorney, Agent, or Firm — Lee & Morse, P.C.

(57) ABSTRACT

A thin film transistor, a display device including the same, and a method of manufacturing the display device, the thin film transistor including a substrate; a gate electrode on the substrate; a gate insulating layer on the gate electrode; a semiconductor layer on the gate insulating layer; and source/drain electrodes electrically connected with the semiconductor layer, wherein the gate electrode has a thickness of about 500 Å to about 1500 Å and the gate insulating layer has a thickness of about 1600 Å to about 2500 Å.

13 Claims, 20 Drawing Sheets

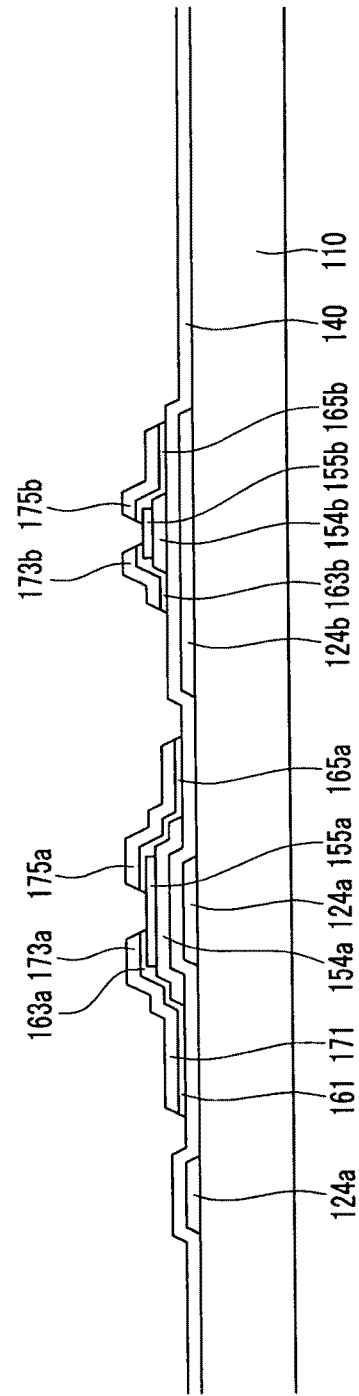

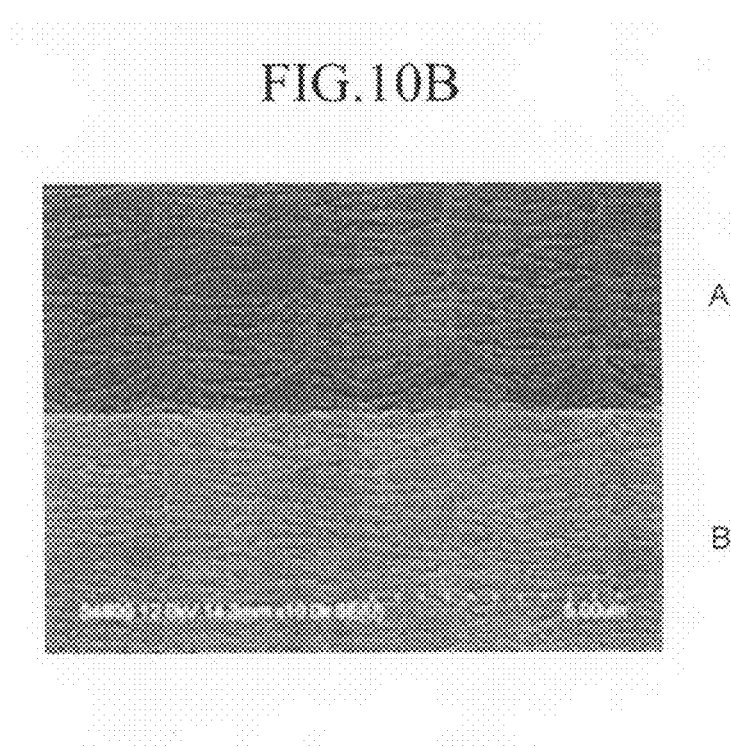

THIN FILM TRANSISTOR, DISPLAY DEVICE INCLUDING THE SAME, AND METHOD OF MANUFACTURING THE DISPLAY DEVICE

BACKGROUND

1. Field

Embodiments relate to a thin film transistor, a display device including the same, and a method of manufacturing the display device.

2. Description of the Related Art

Display devices, e.g., organic light emitting diode display devices and liquid crystal display devices, may include at least one transistor that may be used as a switching element. Generally, a thin film transistor includes a semiconductor layer, a gate electrode on one end of the semiconductor layer to control current flow through the semiconductor layer, and source and drain electrodes connected with both ends of the semiconductor layer to transfer a predetermined amount of electric current through the semiconductor layer.

The semiconductor layer may be formed of polycrystalline silicon (poly-Si) or amorphous silicon (a-Si). However, the poly-Si has been widely used since it exhibits a higher electron mobility than the a-Si. In this case, the poly-Si may be formed by forming an a-Si layer on a substrate and crystallizing the a-Si layer into a poly-Si layer using a crystallization process, e.g., solid phase crystallization (SPC), rapid thermal annealing (RTA), metal-induced crystallization (MIC), metal-induced lateral crystallization (MILC), excimer laser annealing (ELA), or sequential lateral solidification (SLS).

However, when the a-Si layer is formed on the gate electrode and crystallized into a poly-Si layer using ELA or SLS, the heat source of a laser beam, which is irradiated on the a-Si layer, may cause heat to flow toward the gate electrode. The heat flow may then cause insufficient crystal growth of the a-Si. As a result, the poly-Si semiconductor layer may made include an unstable crystal growth region, which may lead to deteriorated driving characteristics and reliability of the thin film transistor.

SUMMARY

Embodiments are directed to a thin film transistor, a display device including the same, and a method of manufacturing the display device, which represents advances over the related art.

It is a feature of an embodiment to provide a thin film transistor including a polycrystalline silicon (poly-Si) semiconductor layer that does not include an unstable crystal growth region.

At least one of the above and other features and advantages may be realized by providing a thin film transistor including a substrate; a gate electrode on the substrate; a gate insulating layer on the gate electrode; a semiconductor layer on the gate insulating layer; and source/drain electrodes electrically connected with the semiconductor layer, wherein the gate electrode has a thickness of about 500 Å to about 1500 Å and the gate insulating layer has a thickness of about 1600 Å to about 2500 Å.

The semiconductor layer may have primary grain boundaries, and a distance between the primary grain boundaries may be about 2.75 μm to about 3 μm.

At least one of the above and other features and advantages may also be realized by providing a display device including a substrate having a first region and a second region; a gate electrode on each of the first region and second region of the substrate, respectively; a gate insulating layer on the gate electrode; semiconductor layers on the gate insulating layer in the first region and second regions of the substrate, respectively; and source/drain electrodes electrically connected with the semiconductor layers on the first region and the second region of the substrate, respectively, wherein the gate electrode has a thickness of about 500 Å to about 1500 Å and the gate insulating layer has a thickness of about 1600 Å to about 2500 Å.

Each of the semiconductor layers may have a primary grain boundary, and a distance between the primary grain boundaries of the respective semiconductor layers may be about 2.75 μm to about 3 μm.

The display device may further include a gate line electrically connected with at least one gate electrode, the gate line being on one of the semiconductor layers corresponding to the at least one gate electrode.

The display device may further include a passivation layer on the substrate including the source/drain electrodes thereon; and a gate line on the passivation layer, the gate line being electrically connected with the gate electrode of the first region through contact holes in the passivation layer and the gate insulating layer on the first region.

The display device may further include a passivation layer on the substrate including the source/drain electrodes; and a connection member on the passivation layer, the connection member being electrically connected with the gate electrode on the second region through contact holes in the passivation layer and the gate insulating layer.

The connection member may be electrically connected with the drain electrode on the first region through a contact hole in the passivation layer.

The display device may further include a contact member on the passivation layer, the contact member being electrically connected with the drain electrode on the second region through contact holes in the passivation layer.

The display device may further include a pixel electrode on the passivation layer, the pixel electrode being electrically connected with the contact member.

At least one of the above and other features and advantages may also be realized by providing a method of manufacturing a display device, the method including providing a substrate including a first region and a second region; forming gate electrodes on the first region and second region of the substrate, respectively; forming a gate insulating layer on the gate electrodes; forming semiconductor layers on the gate insulating layer on the first region and second region of the substrate, respectively; forming source/drain regions on certain regions of the semiconductor layers on the first region and second region of the substrate, respectively; and forming source/drain electrodes in the first region and second region of the substrate, respectively, the source/drain electrodes being electrically connected with the semiconductor layers, wherein the gate electrodes have a thickness of about 500 Å to about 1500 Å and the gate insulating layer has a thickness of about 1600 Å to about 2500 Å.

Each of the semiconductor layers may have a primary grain boundary, and a distance between the primary grain boundaries of the respective semiconductor layers may be about 2.75 μm to about 3 μm.

Forming the semiconductor layer may include crystallization through sequential lateral solidification (SLS).

The SLS may be performed using a mask having regions through which a laser beam penetrates.

The regions through which the laser beam penetrates may have a length of about 4.5 μm to about 5.0 μm, and a distance between the regions through which the laser beam penetrates may be about 1.0 μm to about 1.5 μm.

Forming the semiconductor layers may include forming an amorphous silicon (a-Si) layer on the gate insulating layer, and performing an SLS process on the a-Si layer.

BRIEF DESCRIPTION OF THE DRAWINGS

The above and other features and advantages will become more apparent to those of ordinary skill in the art by describing in detail exemplary embodiments with reference to the attached drawings, in which:

FIG. 10B illustrates an image of crystallization characteristics according to a primary grain boundary.

DETAILED DESCRIPTION

Figure 1A:
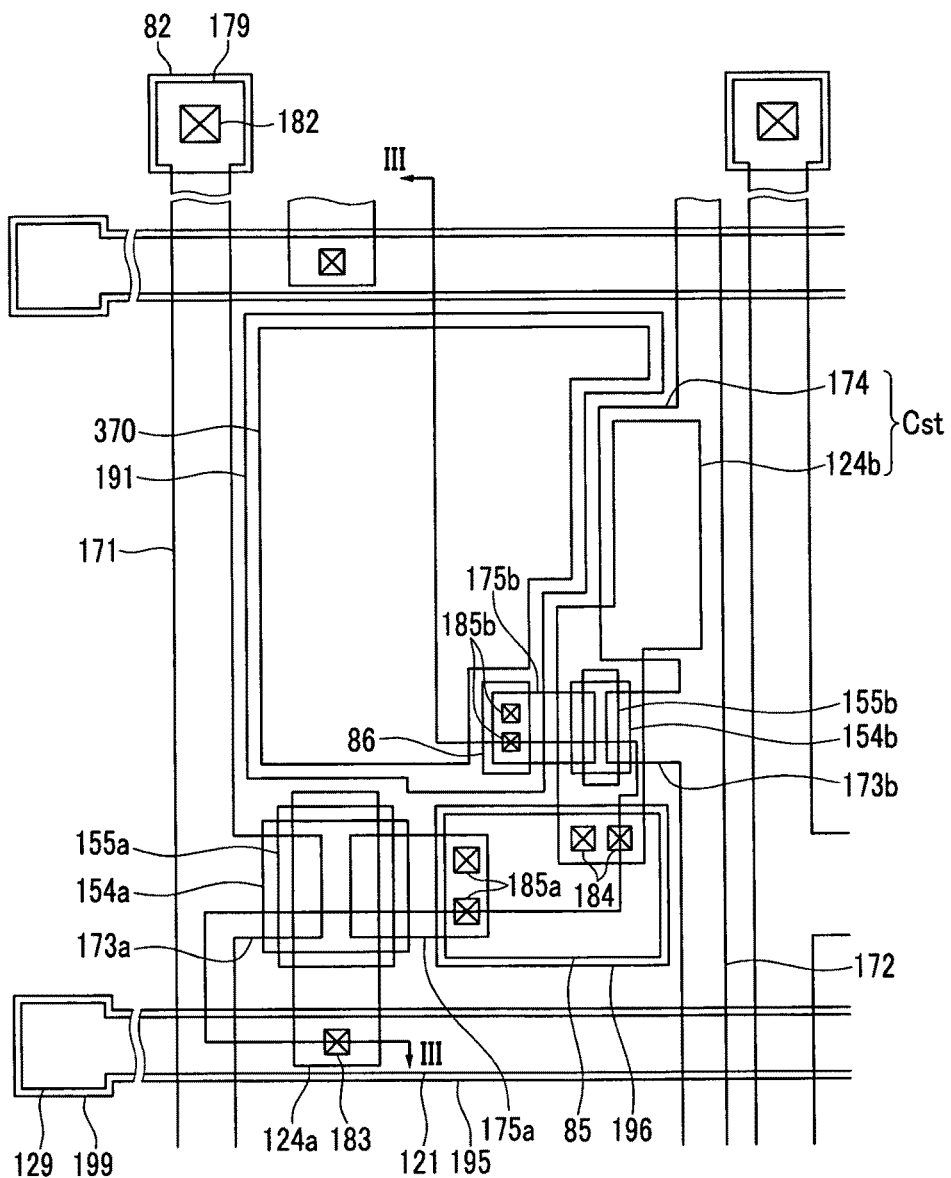
FIG. 1A illustrates a plan view of a display device according to an embodiment.

Korean Patent Application No. 10-2009-0119984, filed on Dec. 4, 2009, in the Korean Intellectual Property Office, and entitled: "Thin Film Transistor and Display Device Having the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1B:
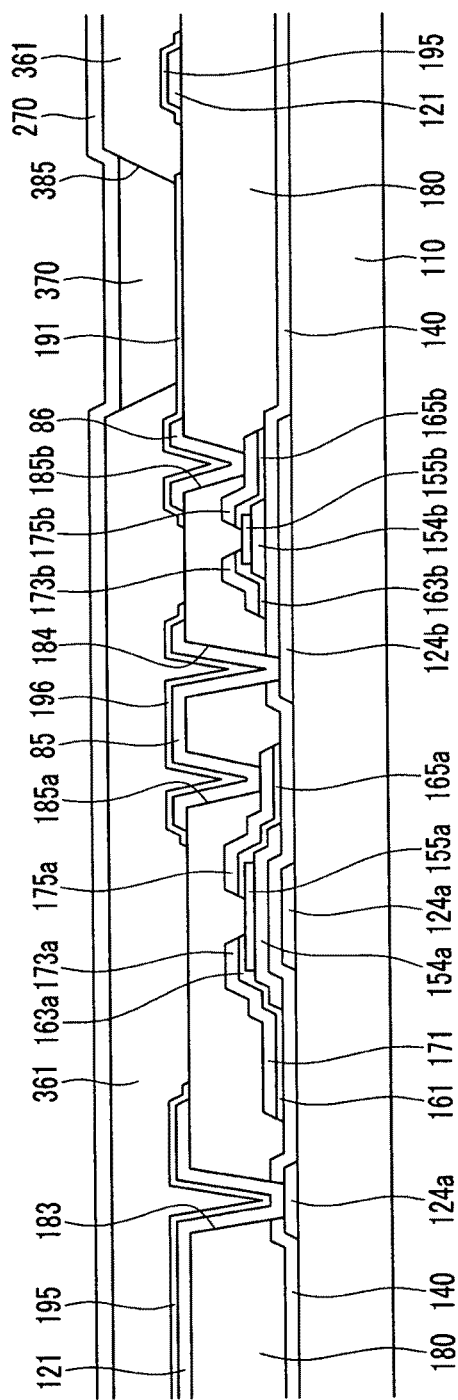
FIG. 1B illustrates a cross-sectional view taken along line of FIG. 1A.

FIG. 1A illustrates a plan view of a display device according to an embodiment. FIG. 1B illustrates a cross-sectional view taken along line of FIG. 1A. FIG. 1A illustrates one example of an organic light emitting display device including an organic light emitting material, but the embodiments are not limited thereto. Accordingly, the embodiments may be applied to a variety of display devices, e.g., a liquid crystal display device using liquid crystal.

Referring to FIGS. 1A and 1B, a switching gate electrode 124a and a driving gate electrode 124b may be formed on an insulating substrate 110 including, e.g., transparent glass or plastic.

The switching gate electrode 124a and the driving gate electrode 124b may be separated from each other and may be in the form of an islet. The switching gate electrode 124a and the driving gate electrode 124b may respectively have a single layer structure made of, e.g., Mo, W, MoW, AlNd, Ti, Cu, a Cu alloy, Al, an Al alloy, Ag, and/or a Ag alloys. In an implementation, the switching gate electrode 124a and the driving gate electrode 124b may respectively have a 2-layer structure made of a low resistance material, e.g., Mo, Cu, Al, and/or Ag, so as to reduce wiring resistance. Alternatively, the switching gate electrode 124a and the driving gate electrode 124b may respectively have a multi-layer structure of 3 or more layers made of, e.g., Mo, Cu, Al, and/or Ag, so as to reduce the wiring resistance.

A thickness of each gate electrode may be about 500 Å to about 1500 Å. Maintaining the thickness of the gate electrodes at about 500 Å or greater may help ensure that the gate electrode is capable of preventing a voltage drop and an increase in resistance. Maintaining the thickness of the gate electrode at about 1500 Å or less may help ensure that a heat flow caused by the gate electrode does not form an unstable crystallization region during a crystallization process. This will be described in detail below.

A gate insulating layer 140 may be formed on the switching gate electrode 124a and the driving gate electrode 124b. The gate insulating layer 140 may be made of, e.g., silicon nitride ($SiN_x$) or silicon oxide ($SiO_2$).

A thickness of the gate insulating layer 140 may be about 1600 Å to about 2500 Å. Maintaining the thickness of the gate insulating layer 140 at about 1600 Å or greater may help ensure that heat flow caused by the gate electrode does not form an unstable crystallization region in a crystallization process. Maintaining thickness of the gate insulating layer 140 at about 2500 Å or less may help ensure that a capacity of a capacitor does not decrease. The capacitor will be described in detail below.

Next, a switching semiconductor layer 154a and a driving semiconductor layer 154b may be formed on the gate insulating layer 140.

The switching semiconductor layer 154a and the driving semiconductor layer 154b may be in the form of islets, respectively. The switching semiconductor layer 154a may overlap with the switching gate electrode 124a and the driving semiconductor layer 154b may overlap with the driving gate electrode 124b. The semiconductor layers 154a and 154b may each be composed of an amorphous silicon (a-Si) layer crystallized into a polycrystalline silicon (poly-Si) layer through, e.g., sequential lateral solidification (SLS).

A distance between primary grain boundaries in the respective poly-Si semiconductor layers 154a and 154b may be less than about 3 μm. Maintaining the distance between primary grain boundaries at less than about 3 μm may help ensure a sufficient degree of crystallization. In an implementation, a distance between primary grain boundaries in the poly-Si layer may be greater than about 2.75 μm. Maintaining the distance between primary grain boundaries at greater than about 2.75 μm may help ensure a sufficient degree of crystallization due to sufficient overlapping regions formed when the a-Si layer is crystallized through SLS.

Etch stoppers 155a and 155b may be formed on the switching semiconductor layer 154a and the driving semiconductor layer 154b, respectively. The etch stoppers 155a and 155b may be made of, e.g., silicon nitride or silicon oxide, and may prevent the switching semiconductor layer 154a and the driving semiconductor layer 154b from being damaged during SLS.

Data lines 171, a switching drain electrode 175a, power supply lines 172, and a driving drain electrode 175b may be formed on the etch stoppers 155a and 155b, the switching semiconductor layer 154a, the driving semiconductor layer 154b, and the gate insulating layer 140, respectively.

The data lines 171 may transfer a data signal and may generally be arranged in a longitudinal direction. Each of the data lines 171 may include a switching source electrode 173a extending toward the switching gate electrode 124a and an end part 179 having a large area so as to come in contact with other layers or external driving circuits.

The switching drain electrode 175a may be separated from the data lines 171 and may face the switching source electrode 173a above the switching semiconductor layer 154a.

The power supply lines 172 may transfer a driving voltage and may generally be arranged in a longitudinal direction. Each of the power supply lines 172 may include a driving source electrode 173b extending toward the driving semiconductor layer 154b and a sustain electrode 174 overlapping with the driving gate electrode 124b. The driving gate electrode 124b may serve as a capacitor bottom electrode and the sustain electrode 174 may serve as a capacitor top electrode. That is, the driving gate electrode 124b, the sustain electrode 174, and a portion of the gate insulating layer 140 between the sustain electrode 174 and the driving gate electrode 124b may form a capacitor (Cst).

The driving drain electrode 175b may be separated from the data lines 171, the switching drain electrode 175a, and the power supply lines 172 and may face the driving source electrode 173b above the driving semiconductor layer 154b.

The data lines 171, the switching drain electrode 175a, the power supply lines 172, and the driving drain electrode 175b may respectively have a single layer structure including, e.g., Mo, W, MoW, AlNd, Ti, Cu, a Cu alloy, Al, an Al alloy, Ag, and/or a Ag alloy. In an implementation, they may respectively have a 2-layer structure made of a low resistance material, e.g., Mo, Cu, Al, and/or Ag, so as to reduce wiring resistance. Alternatively, they may respectively have a multi-layer structure of 3 or more layers made of, e.g., Mo, Cu, Al, and/or Ag, so as to reduce the wiring resistance.

Ohmic contact layers 161, 163a, 163b, 165a, and 165b may be respectively formed under the data lines 171, the switching drain electrode 175a, the power supply lines 172, and the driving drain electrode 175b. The ohmic contact layers 161, 163a, 163b, 165a, and 165b may be formed of materials including, e.g., a-Si, microcrystalline silicon, and/or poly-Si, which may be doped with a high concentration of n-type or p-type impurities. The ohmic contact layers may be arranged on the semiconductor layers 154a and 154b to define a source region and a drain region and may be electrically connected with the source electrodes and the drain electrodes, respectively.

The ohmic contact layers 161, 163a, 163b, 165a, and 165b may have substantially the same shape as the data lines 171, the switching drain electrode 175a, the power supply lines 172, and the driving drain electrode 175b, but may also be formed only between the switching semiconductor 154a and the switching source electrode 173a, between the switching semiconductor 154a and the switching drain electrode 175a, between the driving semiconductor 154b and the driving source electrode 173b, and/or between the driving semiconductor 154b and the driving drain electrode 175b.

A passivation layer 180 may be formed on the data lines 171, the switching drain electrode 175a, the power supply lines 172, and the driving drain electrode 175b. Contact holes 185a, 185b, and 182 for exposing end parts 179 of the switching drain electrode 175a, the driving drain electrode 175b, and the data lines 171, respectively, may be formed on or in the passivation layer 180. Also, contact holes 183 and 184 for exposing the switching gate electrode 124a and the driving gate electrode 124b, respectively, may be formed on or in the passivation layer 180 and the gate insulating layer 140.

Gate lines 121, a connection member 85, and a contact member 86 may be formed on the passivation layer 180.

The gate lines 121 may transfer a gate signal, may extend in a transverse direction, and may generally be formed by intersecting the data lines 171 with the power supply lines 172. The gate lines 121 may be electrically connected with the switching gate electrode 124a through the contact hole 183 and may have an end part 129 having a large area so as to come in contact with other layers or external driving circuits.

The connection member 85 may be connected with the switching drain electrode 175a and the driving gate electrode 124b through the contact holes 184 and 185a. The contact member 86 may contact the driving drain electrode 175b through the contact hole 185b.

The gate lines 121, the connection member 85, and the contact member 86 may respectively have a single layer structure including, e.g., Mo, W, MoW, AlNd, Ti, Cu, a Cu alloy, Al, an Al alloy, Ag, and/or a Ag alloy. In an implementation, the gate lines 121, the connection member 85, and the contact member 86 may respectively have a 2-layer structure made of a low resistance material, e.g., Mo, Cu, Al, and/or Ag, so as to reduce wiring resistance. Alternatively, the gate lines 121, the connection member 85, and the contact member 86 may respectively have a multi-layer structure of 3 or more layers including a low resistance material, e.g., Mo, Cu, Al, and/or Ag, so as to reduce the wiring resistance.

A pixel electrode 191, a first passivation member 195, a second passivation member 196, and a contact auxiliary member 82 may be formed on the gate lines 121, the connection member 85, the contact member 86, and the passivation layer 180.

The pixel electrode 191 may be electrically connected with the driving drain electrode 175b through the contact member 86. The contact member 86 may improve an adhesive property and a contact property between the driving drain electrode 175b and the pixel electrode 191.

The first passivation member 195 may cover the gate lines 121 and the second passivation member 196 may cover the connection member 85. The first passivation member 195 and the second passivation member 196 may prevent the gate line 121 and the connection member 85 from being corroded from contact with a chemical solution, e.g., an etching solution, when subjecting the pixel electrode 191 to photolithography.

The contact auxiliary member 82 may be connected with end parts 179 of the data lines 171 through the contact hole 182. The contact auxiliary member 82 may supplement an adhesive property to the end parts 179 of the data lines 171 and external devices and may protect the data lines 171 and the external devices.

The pixel electrode 191, the first passivation member 195, the second passivation member 196, and the contact auxiliary member 82 may each include, e.g., indium tin oxide (ITO), indium zinc oxide (IZO), tin oxide (TO) and zinc oxide (ZnO), which may be used alone or in combinations thereof.

An organic insulating layer 361 may be formed on the pixel electrode 191, the first passivation member 195, the second passivation member 196, the contact auxiliary member 82, and the passivation layer 180. The organic insulating layer 361 may have an opening 365 through which a portion of the pixel electrode 191 is exposed.

An organic layer 370 may be formed in the opening 365. The organic layer 370 may have a multi-layer structure including an emitting layer (not illustrated) and also an auxiliary layer (not illustrated) for improving luminescence efficiency of the emitting layer.

The emitting layer may be made of, e.g., a polymeric material, an oligomeric material or a mixture thereof, which may innately emit one of the three primary colors, red, green, and blue.

The auxiliary layer may include at least one of, e.g., an electron transport layer (not illustrated), a hole transport layer (not illustrated), an electron injecting layer (not illustrated), and a hole injecting layer (not illustrated). The electron transport layer and the hole transport layer may maintain a balance between electrons and holes and the electron injecting layer and the hole injecting layer may enhance injection of electrons and holes.

The organic layer 370 may realize desired colors in each pixel by having emitting layers that emit red, green, or blue colors in each pixel. Also, the organic layer 370 may realize desired colors by vertically or horizontally forming red, green, and blue emitting layers in each pixel to form a white emitting layer and forming a color filter, which may realize red, green, and/or blue colors, above or below the white emitting layer.

In addition to the 3-color structure including red, green, and blue pixels, a 4-color structure including red, green, blue, and white pixels may be arranged in the form of stripes or a grid to improve luminance.

A common electrode 270 may be formed on the organic layer 370. The common electrode 270 may be formed on an entire surface of the substrate and may be made of an opaque conductor, e.g., gold (Au), platinum (Pt), nickel (Ni), copper (Cu), tungsten (W), and/or alloys thereof, which may be used alone, or in combinations thereof.

The common electrode 270 may form a pair with the pixel electrode 191 to allow electric current to flow to the organic layer 370.

In the organic light emitting display device, the switching gate electrode 124a, the switching source electrode 173a, and the switching drain electrode 175a may be combined to form a switching thin film transistor (Qs) with a switching semiconductor layer 154a. Channels of the switching thin film transistor (Qs) may be formed in the switching semiconductor layer 154a between the switching source electrode 173a and the switching drain electrode 175a.

Also, the driving gate electrode 124b, the driving source electrode 173b, and the driving drain electrode 175b may be combined to form a driving thin film transistor (Qd) with a driving semiconductor layer 154b. Channels of the driving thin film transistor (Qd) may be formed in the driving semiconductor layer 154b between the driving source electrode 173b and the driving drain electrode 175b.

Also, the pixel electrode 191, the organic layer 370, and the common electrode 270 may be combined to form an organic light emitting diode (OLED). In this case, the pixel electrode 191 may become an anode and the common electrode 270 may become a cathode. Alternatively, the pixel electrode 191 may become a cathode and the common electrode 270 may become an anode.

As described above, the gate line 121 and the switching gate electrode 124a connected with the gate line 121 may be arranged on other layers. That is, the gate electrode may be under the semiconductor and the gate line 121 may be above the semiconductor.

As described above, the gate electrodes 124a and 124b may have a thickness of less than about 1500 Å in order to prevent the formation of an unstable crystallization region in a crystallization process. If the gate electrodes and wires, e.g., gate lines, are formed at the same time, the wires, e.g., gate lines, may also have a thickness of less than about 1500 Å. However, resistance may be increased by a decrease in thickness of the wires, which may render it difficult to use the wires in the crystallization process. Accordingly, it may be desirable to form wires, e.g., gate lines 121, using a separate process from the process of forming the gate electrodes 124a and 124b.

Hereinafter, a method of manufacturing an organic light emitting display device as shown in FIGS. 1A and 1B is described in detail, as follows.

FIGS. 2 to 6 illustrate stages in a method of manufacturing a display device according to an embodiment. In this case, FIG. 2A, FIG. 3A, FIG. 4A, FIG. 5A and FIG. 6A illustrate plan views, FIG. 2B illustrates a cross-sectional view taken along line V-V of FIG. 2A, FIG. 3B illustrates a cross-sectional view taken along line VII-VII of FIG. 3A, FIG. 4B illustrates a cross-sectional view taken along line IX-IX of FIG. 4A, FIG. 5B illustrates a cross-sectional view taken along line XI-XI of FIG. 5A, and FIG. 6B illustrates a cross-sectional view taken along line XIII-XIII of FIG. 6A.

Figure 2A:
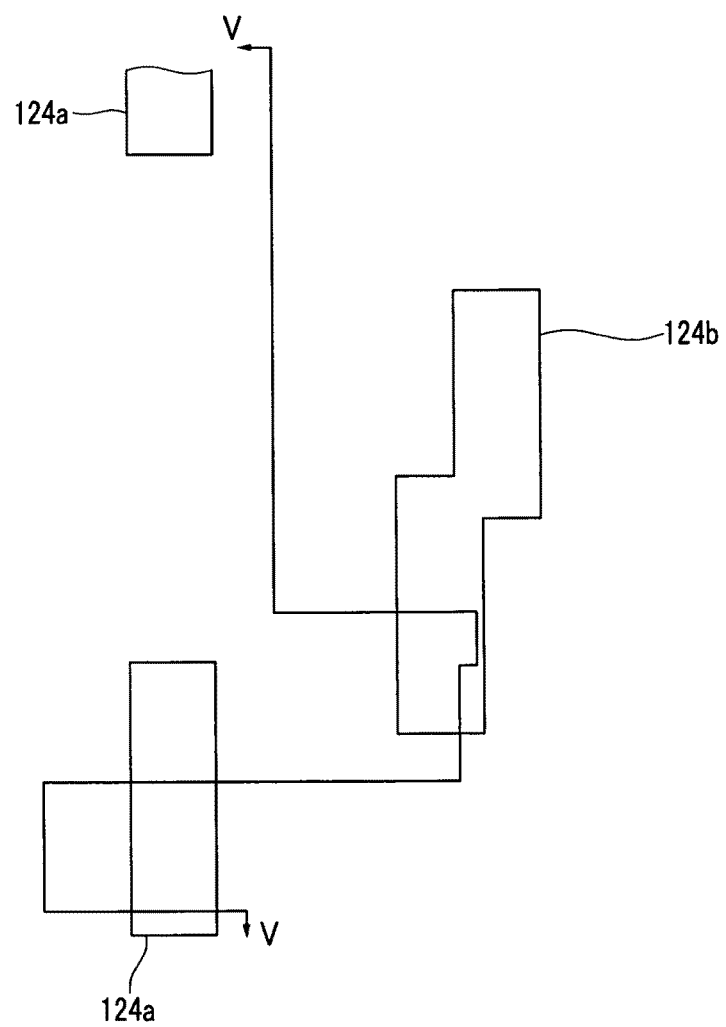
FIGS. 2 to 6 illustrate stages in a method of manufacturing a display device according to an embodiment.
Figure 2B:
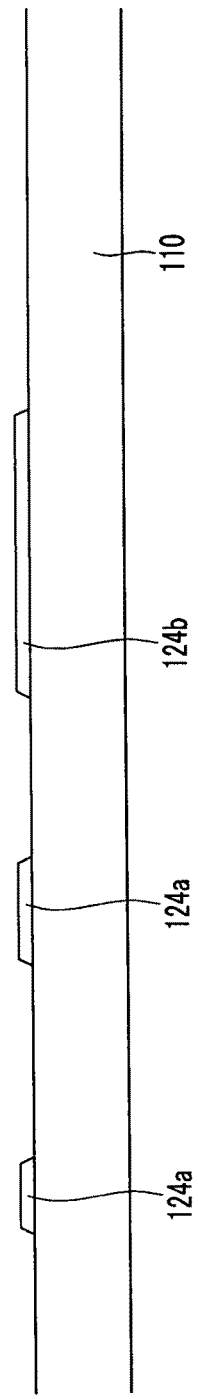

Referring to FIGS. 2A and 2B, a metal layer (not illustrated) may be formed on a substrate 110 and may be subjected to photolithography to form a switching gate electrode 124a and a driving gate electrode 124b.

Figure 3A:
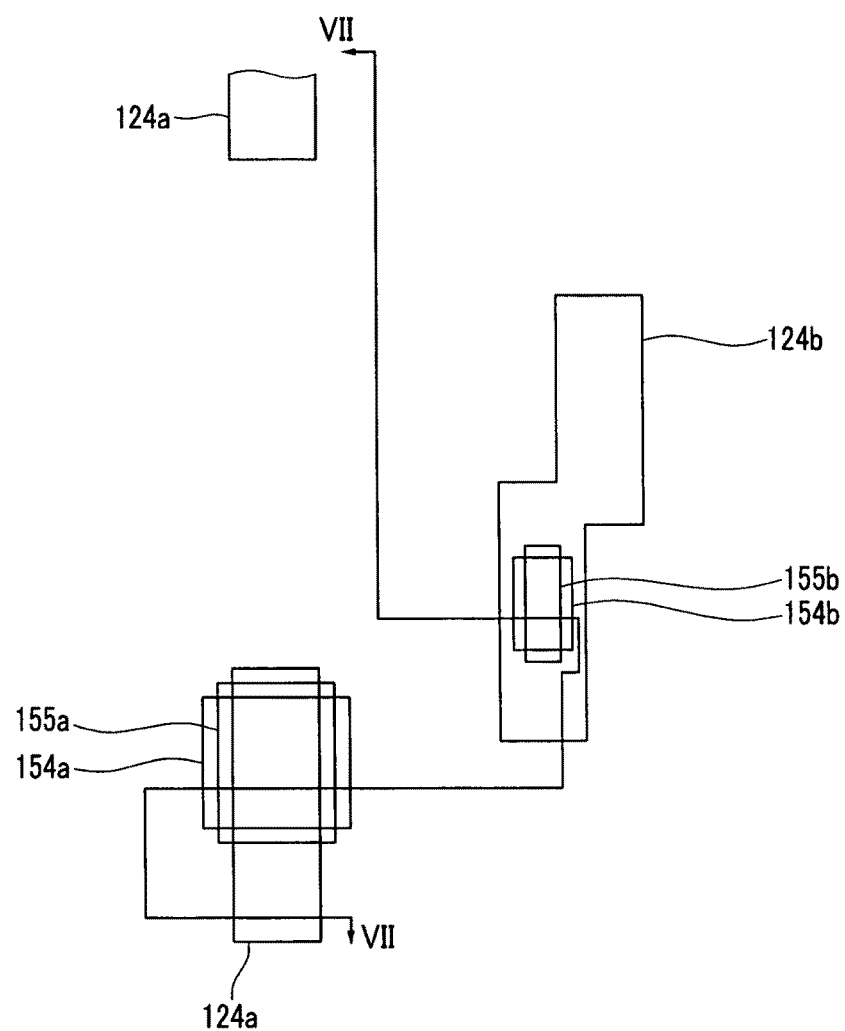
Figure 3B:
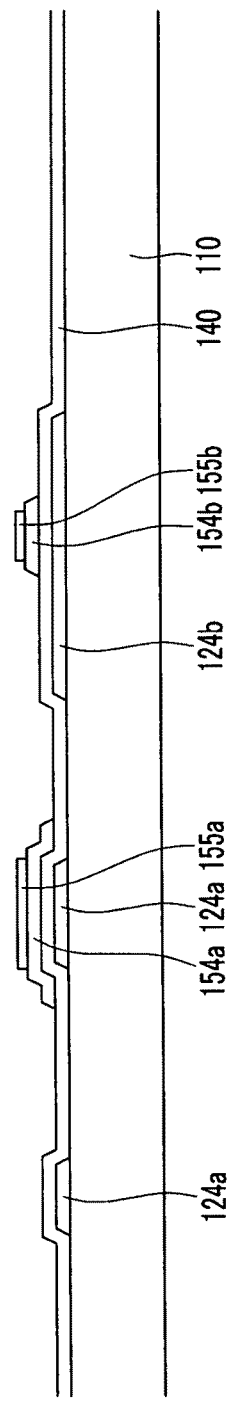

Next, referring to FIGS. 3A and 3B, a gate insulating layer 140 and an a-Si layer (not illustrated) may be sequentially stacked on the substrate 110, the switching gate electrode 124a, and the driving gate electrode 124b. The a-Si layer may then be crystallized into a poly-Si layer.

According to the present embodiment, the crystallization may be performed using SLS.

Figure 7:
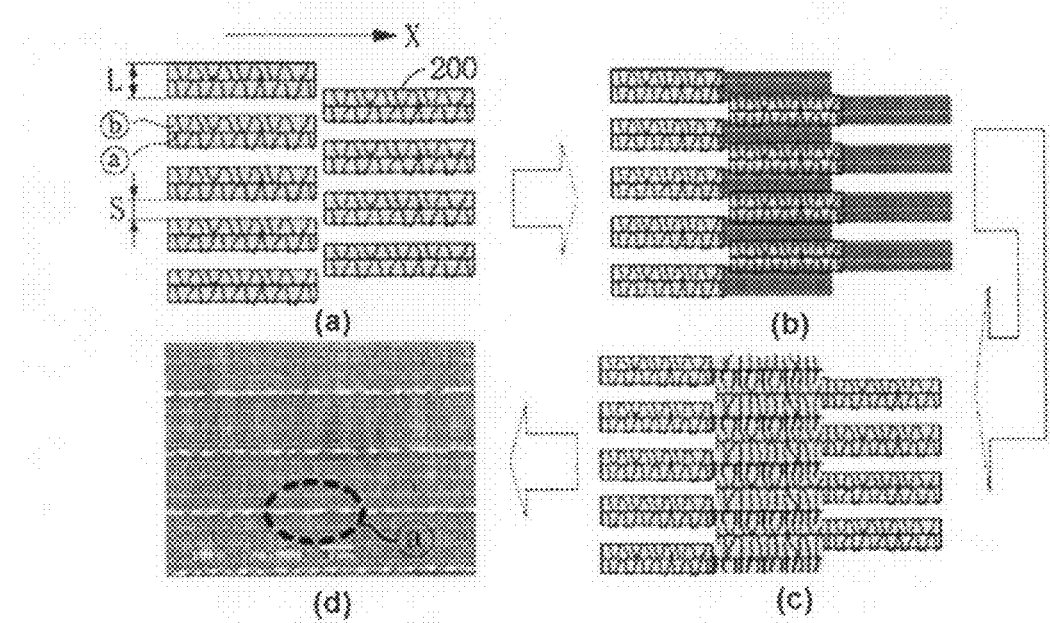
FIG. 7 illustrates a schematic view of a sequential lateral solidification process.

FIG. 7 illustrates a schematic view showing a SLS process.

In general, SLS may be performed by irradiating a laser beam on a lateral side of an a-Si layer 2 or more times to crystallize the a-Si layer into a crystalline silicon (poly-Si) layer. The poly-Si crystal grains prepared with this crystallization process may be characterized by a cylindrical shape which is long in one direction and crystal grain boundaries formed between adjacent crystal grains due to unlimitedly increasing size of the crystal grains.

In SLS, when a laser beam is irradiated on the a-Si layer through a mask 200 having a region through which a laser beam penetrates and a region through which a laser beam does not penetrate, as illustrated in (a), the a-Si in the region through which the laser beam penetrates may be melted.

In this case, the mask 200 may have a length L to define the regions which the laser beam penetrates and/or may have a distance S between the regions that the laser beam penetrates.

When the irradiation of the laser beam is completed and a cooling process starts, crystallization preferentially begins at an a-Si/molten silicon interface. In this case, a temperature gradient where the temperature gradually decreases from the a-Si/molten silicon interface toward a molten silicon layer may occur due to the generated solidification latent heat.

As a result, since the latent heat flows from the mask interface toward the center of the molten silicon layer, the poly-Si crystal grains may grow on a lateral side of the molten silicon layer until the molten silicon layer is completely coagulated.

Subsequently, the mask may move by a stage movement to overlap an a-Si thin film layer with a part of an already crystallized poly-Si layer in order to expose these portions. The laser beam may be irradiated on the a-Si thin film layer and the part of the already crystallized poly-Si layer as shown in (b) to (d), and silicon atoms may be attached to the already formed poly-Si crystal grains that are not covered with the mask when the a-Si and the crystalline silicon are heated and cooled. In this case, the crystal grain may increase in length.

That is, the poly-Si may have boundaries formed between adjacent growing crystal grains, i.e., crystal grain boundaries. In this case, a crystal grain boundary formed in a growth direction of the crystal grains, that is, a laser irradiation direction X, is called a "secondary grain boundary (b)."

Also, since the crystal grains in the poly-Si may grow simultaneously in both boundaries of the molten silicon, the growth of the crystal grains may be finished in the center of the molten silicon and other crystal grain boundaries may be formed between crystal grains that grow in an opposite direction. In this case, a crystal grain boundary formed in the growth direction of the crystal grains, i.e., parallel to a laser irradiation direction X, is called a "primary grain boundary (a)."

In this case, a distance between the primary grain boundaries may be determined by the lengths L of the regions through which a laser beam is penetrating and the distances S of the regions through which the laser beam has penetrated. Here, the distance between the primary grain boundaries may be defined by the expression (L+S)/2.

The distance between the primary grain boundaries may about 2.75 μm to about 3 μm, as described above.

Also, since the distance between the primary grain boundaries may be defined as (L+S)/2, lengths L of the regions through which a laser beam is penetrating, and distances S of the regions through which the laser beam has penetrated are listed in the following Table 1 in order to satisfy the requirements that the distance between the primary grain boundaries is about 2.75 μm to about 3 μm.

TABLE 1

| Distance between primary grain boundaries (μm) | Length (L, μm) | Distance (S, μm) | Overlapping region (μm) | Note |
|---|---|---|---|---|
| 3.0 | 4.5 | 1.5 | 1.5 | Satisfied |
|  | 5.0 | 1.0 | 2.0 | Satisfied |
| 2.75 | 4.0 | 1.5 | 0.25 | Unsatisfied |
|  | 4.5 | 1.0 | 1.75 | Satisfied |
| 2.5 | 3.5 | 1.5 | 1.0 | Unsatisfied |
|  | 4.0 | 1.0 | 1.0 | Unsatisfied |

As described above, SLS may be performed by irradiating a laser beam on the lateral side of the a-Si layer 2 or more times to crystallize the a-Si layer into a crystalline polysilicon (poly-Si) layer. An overlapping region may be generally adjusted to a level of about 1.5 μm for the purpose of this multiple laser irradiation.

As listed in Table 1, it may be seen that the overlapping region may be greater than about 1.5 μm and a length L of the laser beam-penetrating region in the mask may also be about 4.5 to about 5.0 μm so that the distance between the primary grain boundaries is about 2.75 μm to about 3 μm. Also, the distance S between the regions of the mask through which a laser beam has penetrated may be about 1.0 μm to about 1.5 μm.

Next, the poly-Si layer may be subjected to photolithography to form a switching semiconductor layer 154a and a driving semiconductor layer 154b in the form of islets. Then, a silicon nitride layer (not illustrated) may be formed on the switching semiconductor layer 154a and the driving semiconductor layer 154b and may be subjected to photolithography to form etch stoppers 155a and 155b.

Figure 4A:
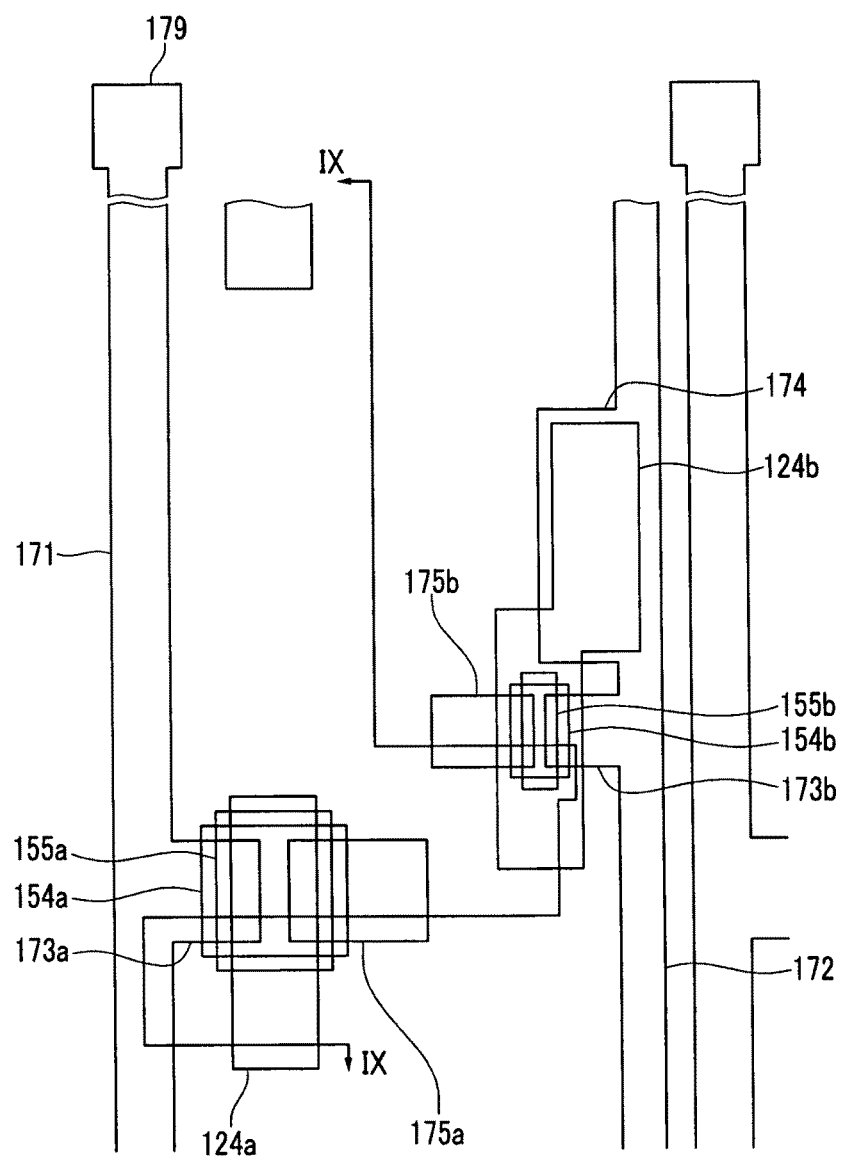

Referring to FIGS. 4A and 4B, an a-Si layer (not illustrated) and a metal layer (not illustrated), which may be doped with impurities, may be sequentially stacked on the gate insulating layer 140, the switching semiconductor layer 154a, the driving semiconductor layer 154b, and the etch stoppers 155a and 155b. The metal layer may be subjected to photolithography to form data lines 171 including a switching source electrode 173a, power supply lines 172 including a driving source electrode 173b, a switching drain electrode 175a, and a driving drain electrode 175b.

Then, the a-Si layer doped with the impurities may be etched using the data line 171, the power supply line 172, the switching drain electrode 175a, and the driving drain electrode 175b as masks to form ohmic contact layers 161, 163a, 163b, and 165b that have substantially the same planar shape as the data lines 171, the power supply lines 172, the switching drain electrode 175a, and the driving drain electrode 175b. In this case, the etch stoppers 155a and 155b may prevent damage to the switching semiconductor layer 154a and the driving semiconductor layer 154b during the etching process.

Figure 5A:
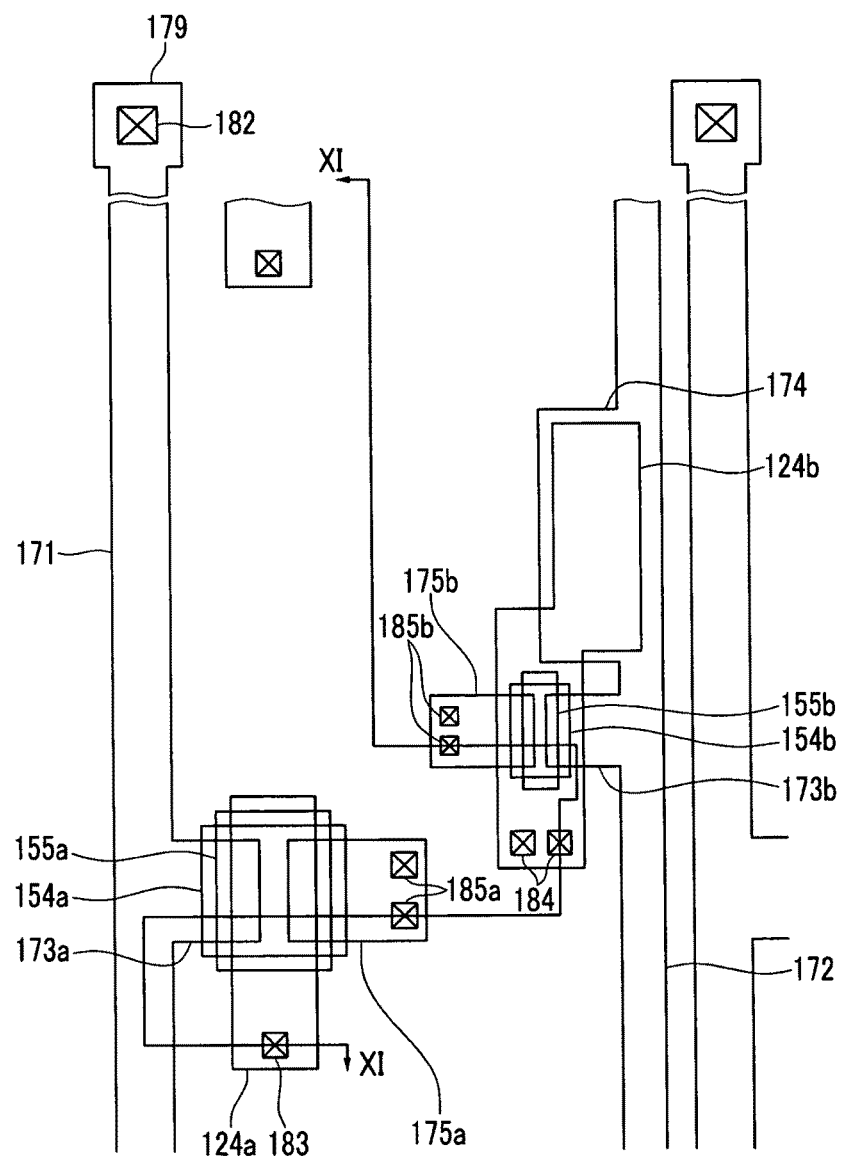
Figure 5B:
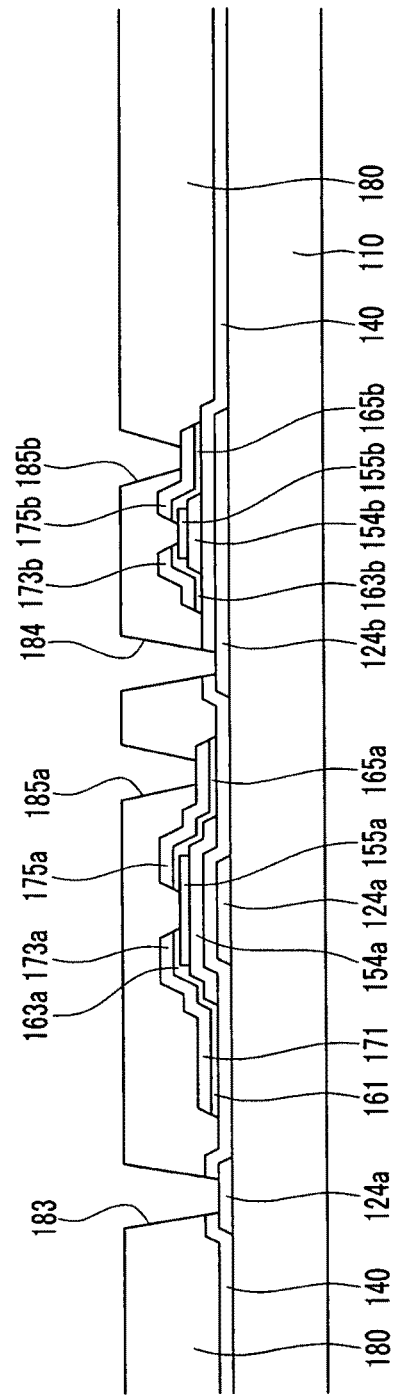

Referring to FIGS. 5A and 5B, a passivation layer 180 may be formed on the data lines 171, the power supply lines 172, the switching drain electrode 175a, the driving drain electrode 175b, and the gate insulating layer 140. The passivation layer 180 and the gate insulating layer 140 may be subjected to photolithography to form a plurality of contact holes 182, 183, 184, 185a, and 185b.

Figure 6A:
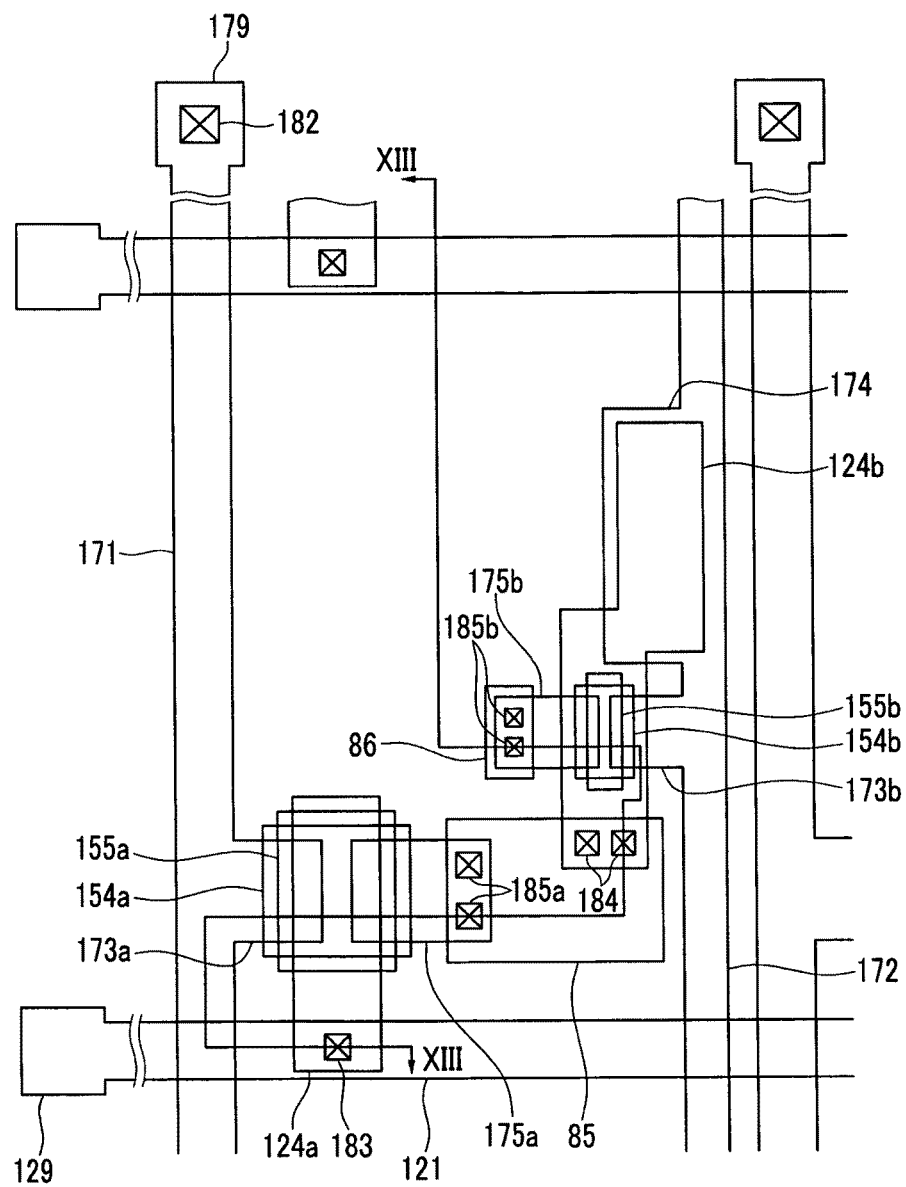
Figure 6B:
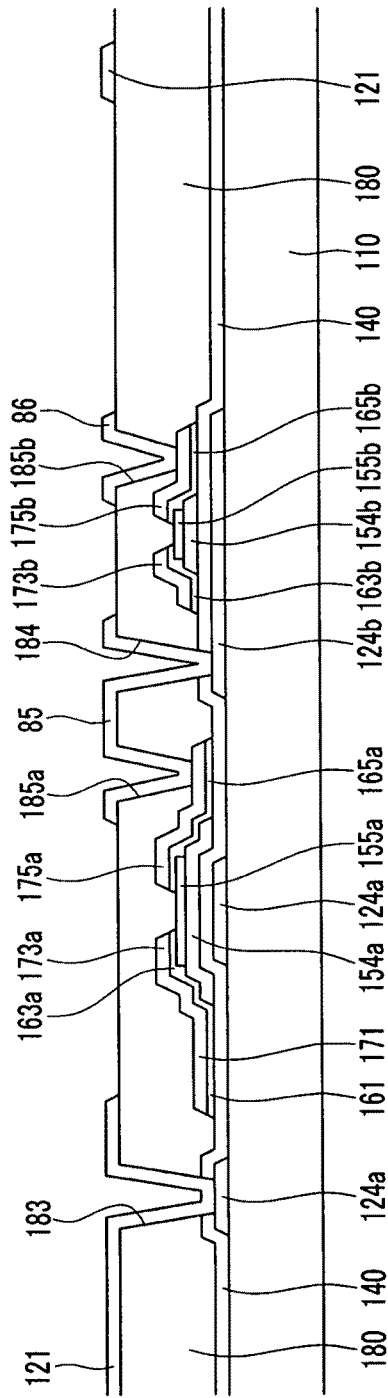

Referring to FIGS. 6A and 6B, a metal layer (not illustrated) may be stacked on the passivation layer 180 and may be subjected to photolithography to form gate lines 121, a connection member 85, and a contact member 86.

Referring again to FIGS. 1A and 1B, an ITO layer (not illustrated) may be stacked on the gate lines 121, the connection member 85, the contact member 86, and the passivation layer 180 and may be subjected to photolithography to form a first passivation member 195 covering the gate line 121, a second passivation member 196 covering the connection member 85, a pixel electrode 191 on the contact member 86, and a contact auxiliary member 82 on the end parts 179 of the data lines 171.

Since the first passivation member 195 and the second passivation member 196 may cover the gate line 121 and the connection member 85, respectively, they may prevent the gate line 121 and the connection member 85 from being corroded from contact with a chemical solution, e.g., an etching solution, in the photolithography process. However, in an implementation, the contact auxiliary member 82, the first passivation member 195, and the second passivation member 196 may not be formed herein.

In an implementation, a planarization layer made of an organic material may be formed on the gate lines 121, the connection member 85, the contact member 86, and the passivation layer 180. Contact holes, through which the contact member 86 electrically connected with the driving drain electrode is exposed, may be formed in the planarization layer. A pixel electrode material may be formed on the planarization layer having an opening and may be patterned to form a pixel electrode. However, additional processes, e.g., a process of forming a planarization layer and a process of forming contact holes on the planarization layer, may be performed, compared to the process as previously described above. The organic material may include, e.g., polyimide, benzocyclobutene series resin, spin-on glass (SOG), and/or acrylate, which may be used alone or in combinations thereof.

Referring to FIGS. 1A and 1B, an organic insulating layer 361 may be applied onto the first passivation member 195, the second passivation member 196, and the pixel electrode 191 and may then be subjected to exposure and development to form an opening 365.

Then, an organic layer 370 including a hole transport layer (not illustrated) and an emitting layer (not illustrated) may be formed in the opening 365. A common electrode 270 may be formed on the organic insulating layer 361 and the organic layer 370.

Accordingly, the display device according to an embodiment may be manufactured.

FIGS. 8A to 8D illustrate images showing crystallization characteristics according to a thickness of a gate electrode.

Figure 8A:
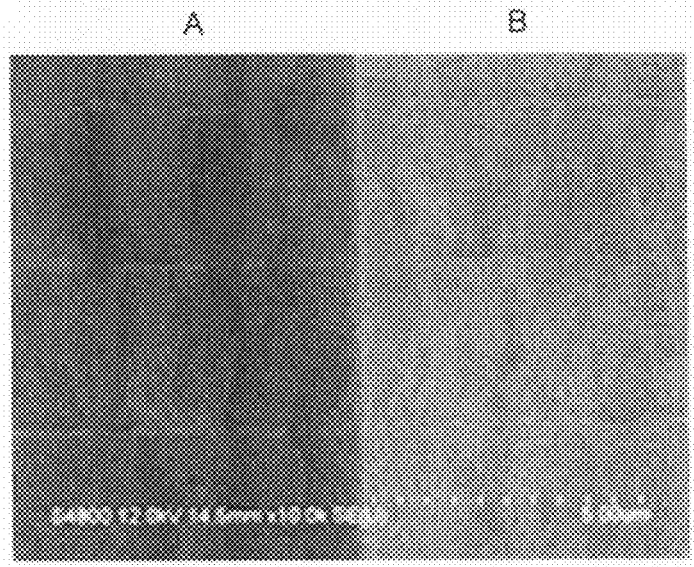
FIGS. 8A to 8D illustrate images of crystallization characteristics according to a thickness of a gate electrode.
Figure 8B:
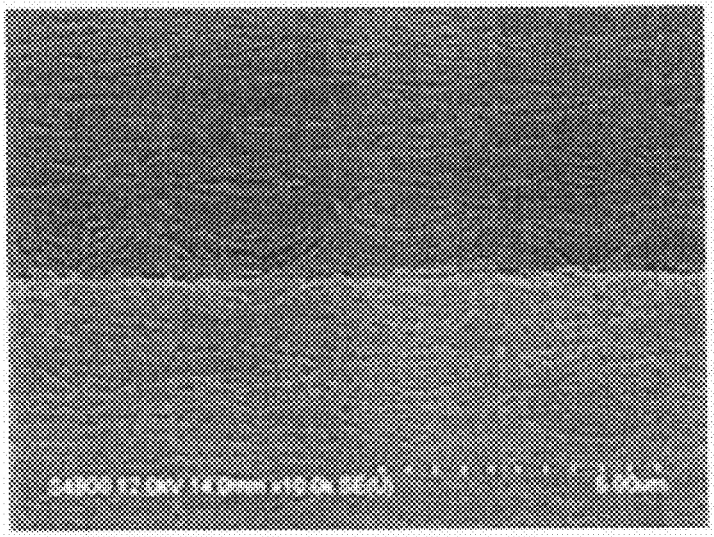
Figure 8C:
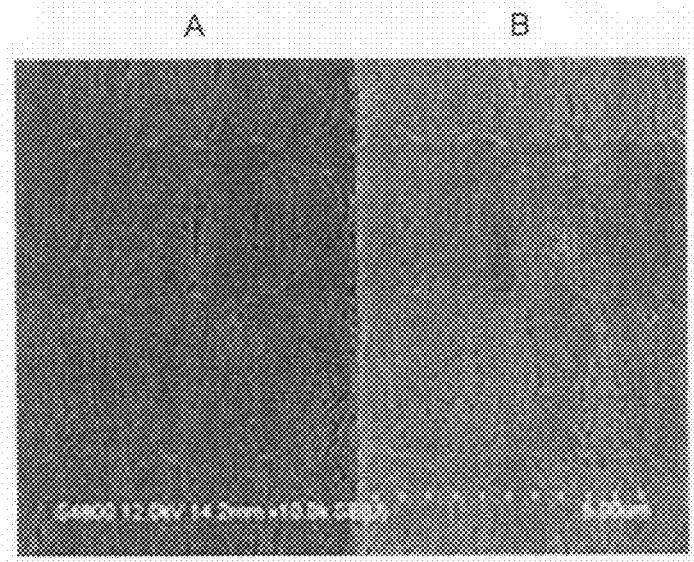

As shown in FIGS. 8A and 8C, when a length L of a region of the mask through which a laser beam is penetrating is about 5.5 μm and a distance S between regions of the mask through which a laser beam penetrated is about 1.5 μm, a distance between the primary grain boundaries may be about 3.5 μm and a thickness of the gate insulating layer may be about 1600 Å. Also, FIG. 8A shows crystallization characteristics when the thickness of the gate electrode is about 500 Å and FIG. 8C shows crystallization characteristics when the thickness of the gate electrode is about 1500 Å.

Figure 8D:
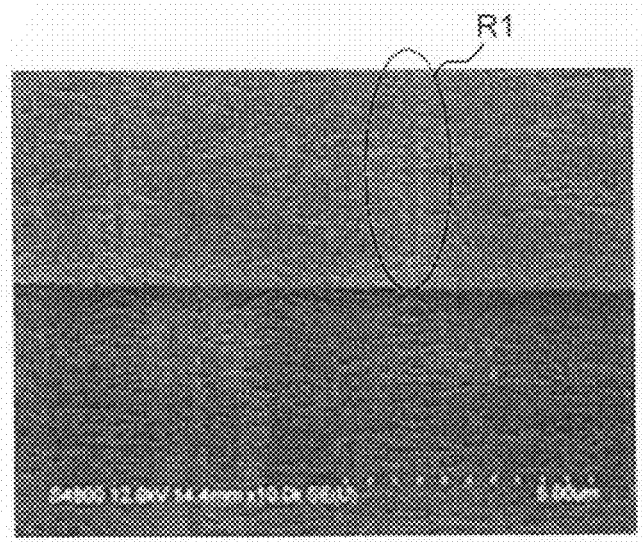

Also as shown in FIGS. 8B and 8D, when a length L of a region of the mask through which a laser beam is penetrating is about 4.5 μm and a distance S between regions of the mask through which a laser beam penetrated is about 1.5 μm, a distance between the primary grain boundaries may be about 3.0 μm and a thickness of the gate insulating layer may be about 1600 Å. Also, FIG. 8B shows crystallization characteristics when the thickness of the gate electrode is about 1000 Å and FIG. 8D shows crystallization characteristics when the thickness of the gate electrode is about 2000 Å.

Also in FIGS. 8A to 8D, 'A' represents a region A on which a metal, namely a gate electrode, is not arranged (hereinafter, referred to as a metal-free region) and 'B' represents a region on which a metal, namely a gate electrode, is arranged (hereinafter, referred to as a metal-containing region), and the regions A and B are compared to each other.

Referring to FIGS. 8A to 8C, when the thickness of the gate electrode is about 500 Å to about 1500 Å, poly-Si layers that do not have an incomplete crystal growth region may be formed in both the metal-free region A and the metal-containing region B. Referring to FIG. 8D, it may be seen that when the thickness of the gate electrode is about 2000 Å, the metal-free region A does not have an incomplete crystal growth region but the metal-containing region B has an incomplete crystal growth region R1.

Accordingly, the thickness of the gate electrode may be about 500 Å to about 1500 Å according to an embodiment.

Figure 9A:
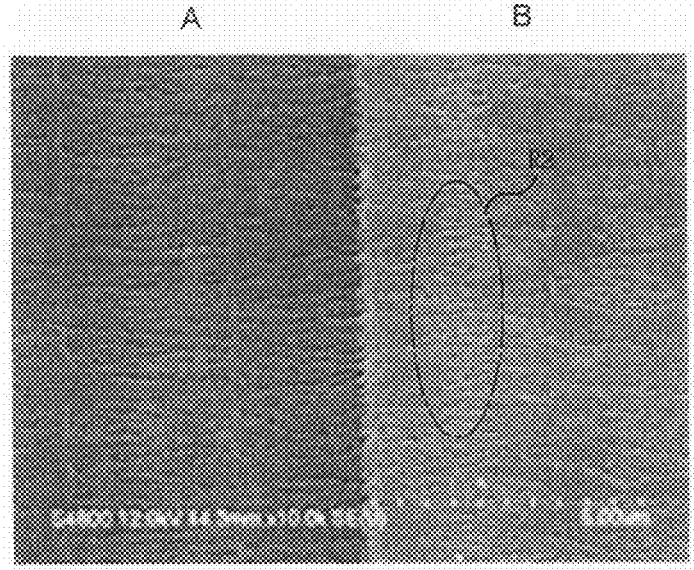
FIGS. 9A to 9C illustrate images of crystallization characteristics according to a thickness of a gate insulating layer.
Figure 9B:
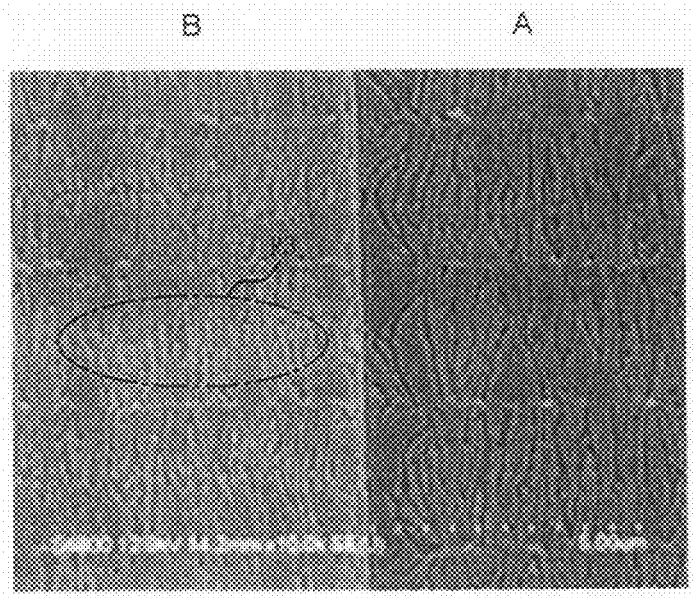
Figure 9C:
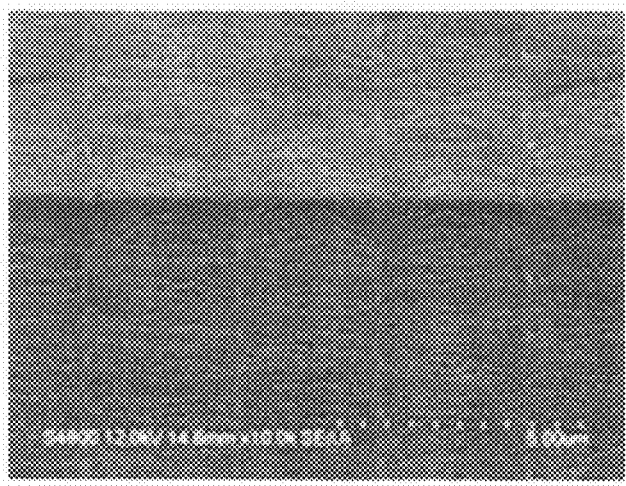

FIGS. 9A to 9C illustrate images showing crystallization characteristics according to a thickness of a gate insulating layer.

As shown in FIGS. 9A to 9C, when a length L of a region of the mask through which a laser beam is penetrating is about 4.5 μm and a distance S between regions of the mask through which a laser beam penetrated is about 1.5 μm, a distance between the primary grain boundaries may be about 3.0 μm and a thickness of the gate insulating layer may be about 1000 Å. FIG. 9A shows crystallization characteristics when the thickness of the gate insulating layer is about 1200 Å, FIG. 9B shows crystallization characteristics when the thickness of the gate insulating layer is about 1400 Å, and FIG. 9C shows crystallization characteristics when the thickness of the gate insulating layer is about 1600 Å.

Also in FIGS. 9A to 9C, 'A' represents a region A on which a metal, namely a gate electrode, is not arranged (hereinafter, referred to as a metal-free region), and 'B' represents a region on which a metal, namely a gate electrode, is arranged (hereinafter, referred to as a metal-containing region), and the regions A and B are compared to each other.

Referring to FIG. 9A to 9B, it may be seen that, when the thickness of the gate insulating layer is about 1600 Å, poly-Si layers which do not have an incomplete crystal growth region may be formed in both the metal-free region A and the metal-containing region B. But, when the thickness of the gate electrode is about 1200 Å to about 1400 Å, the metal-free region A may not have an incomplete crystal growth region and the metal-containing region B has incomplete crystal growth regions R2 and R3.

Accordingly, the thickness of the gate insulating layer may be greater than about 1600 Å according to an embodiment.

Figure 10A:
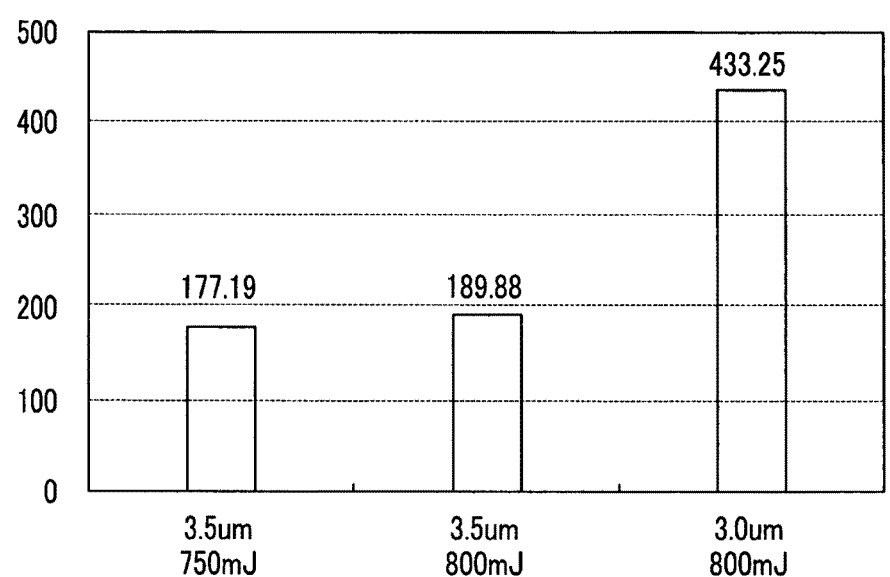
FIG. 10A illustrates a graph of crystallization characteristics according to a primary grain boundary.

FIG. 10A illustrates a graph showing crystallization characteristics according to the primary grain boundary. FIG. 10B illustrates an image showing crystallization characteristics according to the primary grain boundary.

As shown in FIGS. 10A and 10B, the thickness of the gate electrode was set to about 1000 Å and the thickness of the gate insulating layer was set to about 1600 Å.

When a length L of a region of the mask through which a laser beam is penetrating was set to about 5.5 μm and a distance S between regions of the mask through which a laser beam penetrated was set to about 1.5 μm, a distance between the primary grain boundaries was about 3.5 μm. When a length L of a region of the mask through which a laser beam is penetrating was set to about 4.5 μm and a distance S between regions of the mask through which a laser beam penetrated was set to about 1.5 μm, a distance between the primary grain boundaries was about 3.0 μm. In FIG. 10A, 750 mJ and 800 mJ represent laser beam energy.

Referring to FIG. 10A, it may be seen that when the distance between the primary grain boundaries is set to about 3.5 μm, the crystallization characteristics may be poor with a degree of crystallization of less than about 200. It may also be seen that when the distance between the primary grain boundaries is set to about 3.0 μm, the crystallization characteristics may be very good with a degree of crystallization of greater than about 400.

Also as shown in FIG. 10B, it may be seen that, when the distance between the primary grain boundaries is set to about 3.0 μm, poly-Si layers that do not have an incomplete crystal growth region may be formed in both the metal-free region A and the metal-containing region B.

Figure 11:
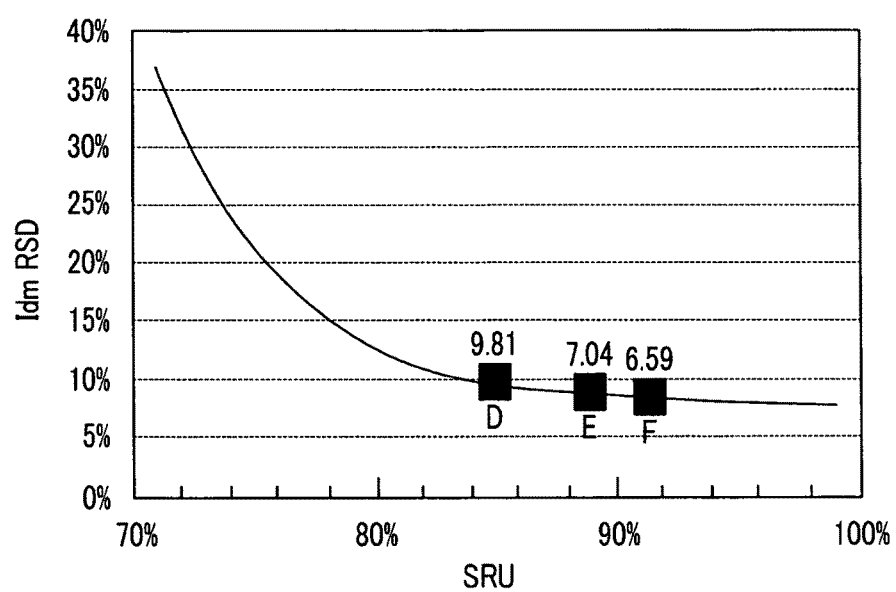
FIG. 11 illustrates a graph of a comparison of relative standard deviation (RSD) characteristics according to a distance between primary grain boundaries.

FIG. 11 illustrates a graph showing a comparison of relative standard deviation (RSD) characteristics according to a distance between the primary grain boundaries.

In FIG. 11, 'D' is a value when the distance between the primary grain boundaries is set to about 3.25 μm, 'E' is a value when the distance between the primary grain boundaries is set to about 3 μm, and 'F' is a value when the distance between the primary grain boundaries is set to about 2.75 μm.

The measurement of RSD values may be performed by measuring I-V curves of the same transistors present in the standard unit area. In this case, Ids values corresponding to constant Vgs may be values obtained by dividing an STDEV value by a mean value, and a short range uniformity (SRU) value is a value obtained by determining the image quality of proximate light emitting points of the same glass used in the measurement of the RSD values. Accordingly, the SRU value is the uniformity obtained by using the luminance deviation in pixels.

In this case, when SRU value accounts for more than about 85%, the display device is considered to have excellent image quality. As shown in FIG. 11, it may be seen that the E and F have RSD values of about 7.04 and about 6.59, respectively.

Accordingly, the distance between the primary grain boundaries may be greater than about 3.0 μm according to an embodiment.

According to the embodiments, a poly-Si layer that does not have an unstable crystal growth region may be provided.

Also according to the embodiments, deterioration of driving characteristics and reliability in a bottom gate-type thin film transistor may be prevented.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A thin film transistor, comprising:
a substrate;
a gate electrode on the substrate;
a gate insulating layer on the gate electrode;
a semiconductor layer on the gate insulating layer; and
source/drain electrodes electrically connected with the semiconductor layer,
wherein:
the gate electrode has a thickness of about 500 Å to about 1500 Å and the gate insulating layer has a thickness of about 1600 Å to about 2500 Å,
the semiconductor layer has primary grain boundaries, and
a distance between the primary grain boundaries is about 2.75 μm to about 3 μm.

2. A display device, comprising:
a substrate having a first region and a second region;
a gate electrode on each of the first region and second region of the substrate, respectively;
a gate insulating layer on the gate electrode;
semiconductor layers on the gate insulating layer in the first region and second regions of the substrate, respectively; and
source/drain electrodes electrically connected with the semiconductor layers on the first region and the second region of the substrate, respectively,
wherein:
the gate electrode has a thickness of about 500 Å to about 1500 Å and the gate insulating layer has a thickness of about 1600 Å to about 2500 Å,
each of the semiconductor layers has a primary grain boundary, and
a distance between the primary grain boundaries of the respective semiconductor layers is about 2.75 μm to about 3 μm.

3. The display device as claimed in claim 2, further comprising a gate line electrically connected with at least one gate electrode, the gate line being on one of the semiconductor layers corresponding to the at least one gate electrode.

4. The display device as claimed in claim 2, further comprising:
a passivation layer on the substrate including the source/drain electrodes thereon; and
a gate line on the passivation layer, the gate line being electrically connected with the gate electrode of the first region through contact holes in the passivation layer and the gate insulating layer on the first region.

5. The display device as claimed in claim 2, further comprising:
a passivation layer on the substrate including the source/drain electrodes; and
a connection member on the passivation layer, the connection member being electrically connected with the gate electrode on the second region through contact holes in the passivation layer and the gate insulating layer.

6. The display device as claimed in claim 5, wherein the connection member is electrically connected with the drain electrode on the first region through a contact hole in the passivation layer.

7. The display device as claimed in claim 5, further comprising a contact member on the passivation layer, the contact member being electrically connected with the drain electrode on the second region through contact holes in the passivation layer.

8. The display device as claimed in claim 7, further comprising a pixel electrode on the passivation layer, the pixel electrode being electrically connected with the contact member.

9. A method of manufacturing a display device, the method comprising:
providing a substrate including a first region and a second region;
forming gate electrodes on the first region and second region of the substrate, respectively;
forming a gate insulating layer on the gate electrodes;
forming semiconductor layers on the gate insulating layer on the first region and second region of the substrate, respectively;
forming source/drain regions on certain regions of the semiconductor layers on the first region and second region of the substrate, respectively; and
forming source/drain electrodes in the first region and second region of the substrate, respectively, the source/drain electrodes being electrically connected with the semiconductor layers,
wherein:
the gate electrodes have a thickness of about 500 Å to about 1500 Å and the gate insulating layer has a thickness of about 1600 Å to about 2500 Å,
each of the semiconductor layers has a primary grain boundary, and
a distance between the primary grain boundaries of the respective semiconductor layers is about 2.75 μm to about 3 μm.

10. The method as claimed in claim 9, wherein forming the semiconductor layer includes crystallization through sequential lateral solidification (SLS).

11. The method as claimed in claim 10, wherein the SLS is performed using a mask having regions through which a laser beam penetrates.

12. The method as claimed in claim 11, wherein:
the regions through which the laser beam penetrates have a length of about 4.5 μm to about 5.0 μm, and
a distance between the regions through which the laser beam penetrates is about 1.0 μm to about 1.5 μm.

13. The method as claimed in claim 9, wherein forming the semiconductor layers includes:
forming an amorphous silicon (a-Si) layer on the gate insulating layer, and
performing an SLS process on the a-Si layer.

* * * * *